United States Patent
Switky et al.

(10) Patent No.: US 9,500,222 B2
(45) Date of Patent: Nov. 22, 2016

(54) PASSIVE SUCTION BASE

(71) Applicant: Qwest Communications International Inc., Denver, CO (US)

(72) Inventors: Andrew Switky, Menlo Park, CA (US); Adam Vollmer, San Francisco, CA (US)

(73) Assignee: Qwest Communications International Inc., Denver, CO (US)

( * ) Notice: Subject to any disclaimer, the term of this patent is extended or adjusted under 35 U.S.C. 154(b) by 0 days.

(21) Appl. No.: 13/722,908

(22) Filed: Dec. 20, 2012

(65) Prior Publication Data

US 2013/0161460 A1 Jun. 27, 2013

Related U.S. Application Data

(60) Provisional application No. 61/579,886, filed on Dec. 23, 2011.

(51) Int. Cl.
*F16B 47/00* (2006.01)

(52) U.S. Cl.
CPC ............. *F16B 47/00* (2013.01); *F16B 47/003* (2013.01); *F16B 47/006* (2013.01); *Y10T 29/49826* (2015.01)

(58) Field of Classification Search
CPC .... F16B 47/00; F16B 47/003; F16B 47/006; B60R 2011/0056; B60R 2011/0068; A47G 1/17; A47G 1/175; Y10T 29/49826; Y10S 292/28; Y10S 116/24
USPC ............ 248/205.8, 205.5, 206.2, 537, 309.3, 248/363, 205.3, 205.7, 206.3
See application file for complete search history.

(56) References Cited

U.S. PATENT DOCUMENTS

| | | | | |
|---|---|---|---|---|
| 122,890 | A * | 1/1872 | Hodgkins | F16B 47/00 248/205.8 |
| 952,495 | A * | 3/1910 | Austin | 248/205.8 |
| 5,133,524 | A * | 7/1992 | Liu | 248/205.8 |
| 6,478,271 | B1 * | 11/2002 | Mulholland | F16B 47/00 248/205.8 |
| 2004/0242285 | A1 * | 12/2004 | Farshi | 455/569.2 |
| 2006/0065799 | A1 * | 3/2006 | Fontana et al. | 248/231.91 |
| 2010/0193649 | A1 * | 8/2010 | Wiegers | 248/183.1 |
| 2012/0147612 | A1 * | 6/2012 | Verhoeven et al. | 362/397 |

OTHER PUBLICATIONS

U.S. Appl. No. 13/722,891, filed Dec. 20, 2012, 21 pages.
U.S. Appl. No. 13/722,902, filed Dec. 20, 2012, 34 pages.

* cited by examiner

*Primary Examiner* — Nkeisha Smith
(74) *Attorney, Agent, or Firm* — Swanson & Bratschun, L.L.C.

(57) ABSTRACT

Novel tools and techniques are described for a passive suction base. In one aspect, a passive suction base can be provided on a bottom of an item for adhering the item to a flat surface. The passive suction base might comprise a central portion affixed to the bottom of the item and a perimeter portion that is not affixed to the item. A force opposing the flat surface when applied to the item causes the central portion to move away from the flat surface, while the perimeter portion remains in contact with the flat surface, thereby causing the passive suction base to adhere to the flat surface. In some aspects, when resting on the flat surface, the perimeter portion of the suction base can be substantially flat with respect to the flat surface (and not visible), so that the passive suction base may be easily moved along the flat surface.

14 Claims, 10 Drawing Sheets

PASSIVE SUCTION BASE

CROSS-REFERENCES TO RELATED APPLICATIONS

This application claims priority to U.S. Provisional Patent Application No. 61/579,886, filed Dec. 23, 2011, by Switky et al. and titled, "PASSIVE SUCTION BASE" which is hereby incorporated by reference, as if set forth in full in this document, for all purposes.

The present disclosure may also be related to the following commonly assigned application(s)/patent(s):

U.S. patent application Ser. No. 12/773,742, filed May 4, 2010 by Gibson et al. and titled, "Multi-Client Local Network Base Station" (published as US PG Pub. No. 2011/0276885 A1 on Nov. 10, 2011) (hereinafter, the "'742 Application"), which is incorporated herein by reference in its entirety;

U.S. patent application Ser. No. 13/722,891 by Yurchenco et al. and titled "Charging Contact System", which claims priority to provisional U.S. patent application Ser. No. 61/580,051, filed on Dec. 23, 2011, both of which are incorporated by reference herein in their entirety; and U.S. patent application Ser No. 13/722,902 by Riering-Czekalla et al. and titled "Magnetic Docking Base for Handset", which claims priority to provisional U.S. patent application Ser. No. 61/579,884, filed on Dec. 23, 2011, both of which are incorporated by reference herein in their entirety.

The respective disclosures of these applications/patents are incorporated herein by reference in their entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to passive suction bases for any table-top/counter-top items, and, more particularly, to a passive suction base for docking bases for portable devices.

BACKGROUND

In traditional docking bases for portable devices, such as portable handsets for telephones, molded carriages are formed in the docking bases to cradle the portable handsets, by generally conforming to a shape of at least a portion of the handset. By conforming to the shape of the handset in this manner, the handset may be positioned in the cradle of the docking base in only one orientation, so that contacts on the handset make contact with corresponding contacts on the docking base. The contacts on the docking base are thus always positioned to deliver power to the handset when the handset is docked with the docking base (i.e., with the contacts on the handset in contact with the contacts on the docking base).

Traditionally, such docking bases for portable devices have comprised rubber or elastomeric "feet" that provide friction to prevent the docking bases from shifting about. Such "feet," however, do not prevent the docking base itself from being inadvertently lifted off a table-top or counter surface on which the docking base rests, especially when the handset does not come clear of its cradle as it is being undocked. In such cases, the handset will tug onto the cradle, resulting in the docking base itself being lifted from the table-top or counter surface. When the handset finally clears its cradle, the docking base may fall to the table-top or counter surface, thus potentially damaging the docking base and/or any other items underneath it when it falls.

To solve this problem, some prior art docking bases have comprised conventional circular suction cups on the bottoms thereof (typically four suction cups, one at each corner of a rectangular or square docking base). Such conventional suction cups, although capable of preventing inadvertent lifting of the docking bases, are difficult to disengage from the table-top or counter surface. Each individual suction cup must be disengaged by lifting an edge thereof (typically by pulling on an elastomeric pull-tab located near one edge of each suction cup). In order to allow for such disengagement of each conventional circular suction cup, the suction cups necessarily must be exposed by some distance to allow for a person's finger and thumb to reach for the elastomeric pull-tab. Accordingly, the docking base necessarily must be raised by said distance above the table-top or counter surface. Because of such limitations in terms of the disengagement of the traditional docking base, the traditional docking base necessarily becomes cumbersome to use and inelegant or unsightly in design.

The embodiments disclosed herein are directed toward overcoming one or more of the problems discussed above.

BRIEF SUMMARY

Various embodiments provide techniques to enable docking and undocking of electronic devices to docking bases, while preventing the docking bases from being inadvertently lifted during undocking of the electronic devices.

According to some embodiments, the docking station or other item may have a passive suction base attached or affixed to the bottom thereof. The passive suction base, in some embodiments, may include a flap portion comprising a central portion and a perimeter portion. In some embodiments, the passive suction base further includes a base portion that may be affixed or attached to the bottom of the docking station, with the central portion affixed to a bottom surface of the base portion. The base portion, in some cases, may comprise a foot portion that may surround at least a portion or the entirety of the flap portion, e.g., when the item (and thus the passive suction base) is resting on a flat surface. When a force opposing the flat surface is applied to the item, the force causes the central portion of the flap portion to move away from the flat surface, while the perimeter portion remains in contact with the flat surface, thereby generating negative relative pressure (i.e., a vacuum) between the flap portion and the flat surface. The negative relative pressure (or vacuum) causes the passive suction base to adhere to the flat surface. To disengage or lift the item from the flat surface, the item (and thus the passive suction base) may be moved to an edge of the flat surface such that a portion of the perimeter portion is exposed (i.e., no longer in contact with the flat surface), thereby eliminating or releasing any negative relative pressure, thus allowing the item to be removed from the flat surface. Such functionality may eliminate any cumbersome aspects that may be present with conventional or prior art suction cup systems.

In some embodiments, the perimeter portion may be recessed (i.e., hidden from external view) by a base portion having a foot portion that may surround the perimeter portion, thereby preserving an aesthetic property of the item (i.e., eliminating any inelegant or unsightly modifications to the item).

In one aspect, a passive suction base is provided for anchoring an item to a flat surface. The passive suction base may comprise a central portion affixed to the item and a perimeter portion not affixed to the item. A force opposing the flat surface, when applied to the item, may cause the central portion to move away from the flat surface, while the perimeter portion may remain in contact with the flat surface. The passive suction base may thereby be caused to adhere to the flat surface. The perimeter portion, according to some embodiments, may lay flat against the flat surface (with the central portion flat or almost flat with respect to the flat surface) when the item with the passive suction base is resting on the flat surface, thereby allowing the item to be easily moved along the flat surface (perhaps while resting on the foot portion).

In another aspect, a docking station for an electronic device is provided that comprises the passive suction base as described above.

In yet another aspect, a method is described that may comprise placing the docking station with the passive suction base (as discussed above) on the flat surface. The method may further comprise sliding the docking station to an edge of the flat surface, so that at least a portion of the perimeter portion is no longer in contact with the flat surface. The docking station may subsequently be removed from the flat surface.

Various modifications and additions can be made to the embodiments discussed without departing from the scope of the invention. For example, while the embodiments described above refer to particular features, the scope of this invention also includes embodiments having different combination of features and embodiments that do not include all of the above described features.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF CERTAIN EMBODIMENTS

While various aspects and features of certain embodiments have been summarized above, the following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

A set of embodiments provides a novel passive suction base, which can be used on a variety of items, including, without limitation, base stations and/or docking stations for electronic devices, telephone sets, monitor stands, stationary dispensers, etc. Merely by way of example, the '742 Application describes a number of communication systems, including base stations, tablet systems, and handset systems, any (or all) of which can employ various embodiments of the novel passive suction base described herein. This passive suction base can also be implemented in conjunction with the charging contact systems described in U.S. patent application Ser. No. 13/722,891 by Yurchenco et al. and titled "Charging Contact System", which claims priority to provisional U.S. patent application Ser. No. 61/580,051, filed on Dec. 23, 2011, both of which are incorporated by reference herein in their entirety, and U.S. patent application Ser. No. 13/722,902 by Riering-Czekalla et al. and titled "Magnetic Docking Base for Handset", which claims priority to provisional U.S. patent application Ser. No. 61/579,884, filed on Dec. 23, 2011, both of which are incorporated by reference herein in their entirety.

In one aspect, embodiments provide a passive suction base that provides sufficient force to anchor an item to a flat surface. For example, by reference to FIGS. 1-7, the passive suction base can be used to anchor a docking station without lifting the docking station from the surface on which it rests. Although the figures illustrate the passive suction base for use with a docking station for an electronic device(s) (e.g., mobile telephones/smartphones, tablet computers, wireless telephone handsets, music players, personal digital assistants ("PDAs"), and/or the like), the various embodiments are not so limited. The passive suction base may, in some embodiments, be used with any item, including, but not limited to, a base portion of a telephone set, a monitor/TV stand, drink coasters, stationary dispensers (e.g., 3M® Post-it® note/flag dispensers, Scotch® tape dispensers, paper-clip dispensers, binder clip dispensers, etc.), pen/pencil cups, paper cutters, paper hole punchers, tissue paper dispensers, water flasks, kettles, trivets, etc.

Figure 4:
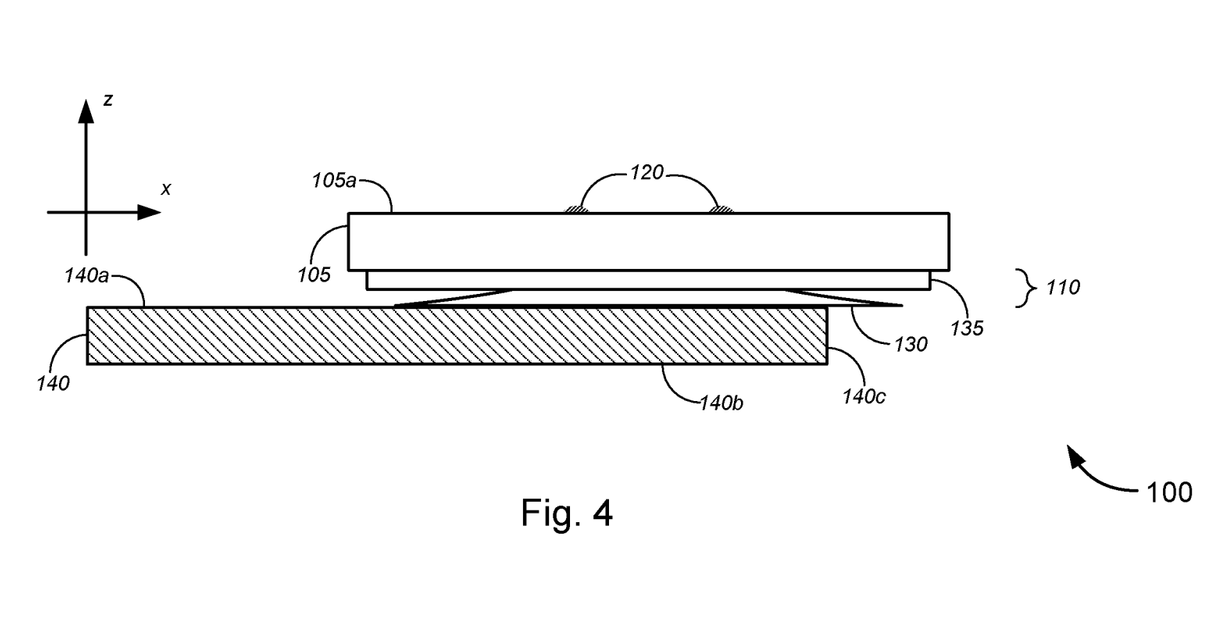
FIG. 4 is a front elevation view of a docking station with a passive suction base as it is being disengaged from a flat surface, in accordance with various embodiments.

In another aspect, however, the passive suction base can be employed without any special handling or conscious effort by a user, merely by positioning the item (e.g., a docking station) with the passive suction base against a flat surface, such as a table, desk, countertop, e.g., as shown in FIG. 2-5, and/or the like, to which the base will adhere. When placed on the flat surface, any upward force (or more precisely, any force generally normal to the flat surface in a direction opposite the flat surface) on the item with the passive suction base will cause a central portion of the passive suction base to move away from the flat surface, while a perimeter portion of the passive suction base remains in contact with the flat surface, effectively increasing the volume between the passive suction base and the flat surface. This increase in volume results in negative relative pressure between the passive suction base and the flat surface, resulting in adhesion between the passive suction base and the flat surface. The passive suction base can be disengaged from the flat surface easily, by sliding the item with the passive suction base until the passive suction base reaches an edge of the surface to which it is adhered, at which point the contact adhesion is broken (and the vacuum is breached) and the suction base (and the item) no longer adheres to the flat surface, thereby allowing the easy removal (i.e., easy lifting) of the item having the passive suction base from the flat surface, e.g., as shown in FIG. 4.

FIGS. 1-7 variously illustrate some of these features. The skilled reader should note that the illustrated devices and systems as shown in FIGS. 1-7 refer to examples of different embodiments that include various components that can be considered alternatives and/or can be used in conjunction with one another, in various embodiments. In some aspects, some of the various embodiments may be the same or similar embodiment. Further, as discussed above, although FIGS. 1-7 show the passive suction base being used with a docking station for an electronic device, the passive suction base may be used with any item (including, but not limited to, a base portion of a telephone set, a monitor/TV stand, drink coasters, various stationary dispensers, pen/pencil cups, paper cutters, paper hole punchers, tissue paper dispensers, water flasks, kettles, trivets, etc.). Hence, the description herein of the illustrated devices and systems as shown in FIGS. 1-7 is provided for purposes of illustration and should not be considered to limit the scope of different embodiments.

Figure 7A:
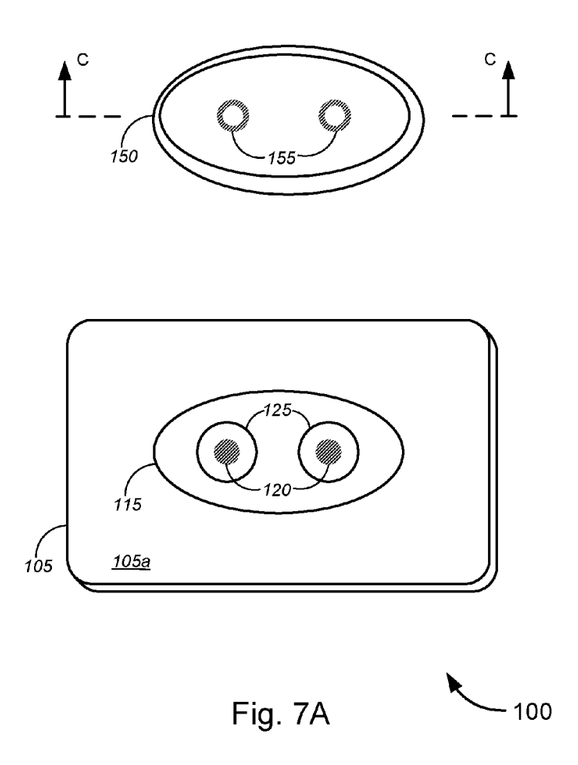
FIG. 7A is a generalized diagram illustrating a top perspective view of a docking station together with a bottom perspective view of a wireless handset, in accordance with various embodiments.
Figure 7B:
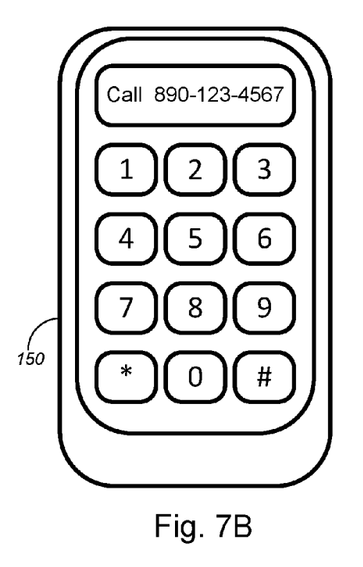
FIG. 7B is a front elevation view of the wireless handset as shown in FIG. 7A, in accordance with various embodiments.
Figure 7C:
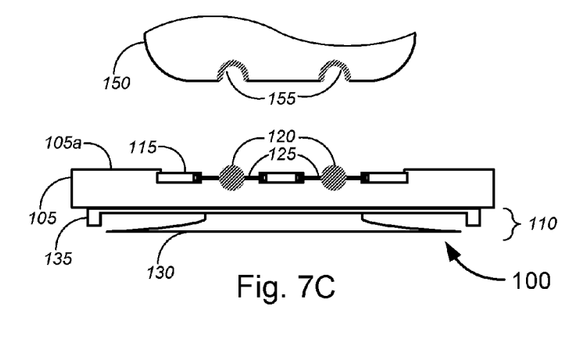
FIG. 7C is a front sectional view of the docking station as shown along the A-A direction in FIG. 1A and a front sectional view of the wireless handset as shown along the C-C direction in FIG. 7A, in accordance with various embodiments.

FIG. 1 illustrates a set of examples of docking/charging system 100 that utilizes passive suction base 110, in accordance with various embodiments. FIG. 1A is a top elevation view of a docking station 105 with a passive suction base 110, in accordance with various embodiments. (It should be appreciated that such a docking/charging system 100 could be used with a tablet computer system, a handset, or for any other type of electronic device that requires contact charging (e.g., for batteries internal to the device)). In an aspect as shown in FIG. 1A, docking station 105 has a generally flat surface 105a onto which an electronic device (e.g., a wireless handset, as shown in FIG. 7) can be placed. The docking station 105 (or the surface 105a thereof) comprises a contact surface 115, charging contacts 120, and contact discs 125. A detailed description of exemplary docking stations, which can serve as docking station 105, may be found, e.g., in U.S. patent application Ser. No. 13/722,891 by Yurchenco et al. and titled "Charging Contact System" and in U.S. patent application Ser. No. 13/722,902 by Riering-Czekalla et al. and titled "Magnetic Docking Base for Handset", as mentioned above, both of which are incorporated by reference herein in their entirety. Various embodiments described in the present disclosure can serve as a base for any of such docking stations, as well as for any other suitable devices.

Figure 1A:
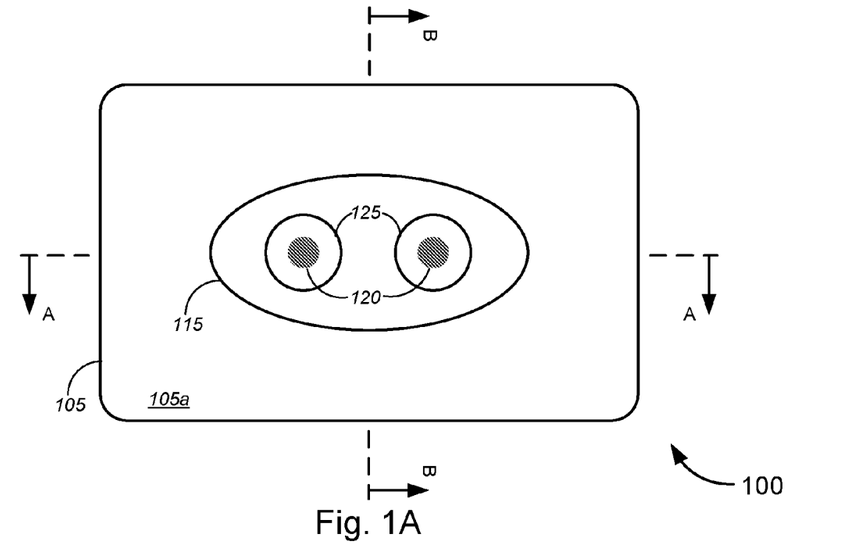
FIG. 1A is a top elevation view of a docking station with a passive suction base, in accordance with various embodiments.
Figure 1B:
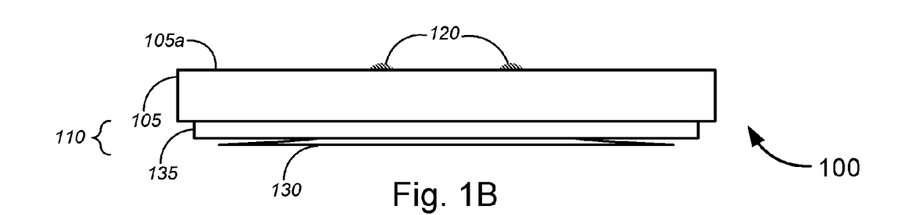
FIG. 1B is a front elevation view of a docking station with a passive suction base, in accordance with various embodiments.
Figure 1C:
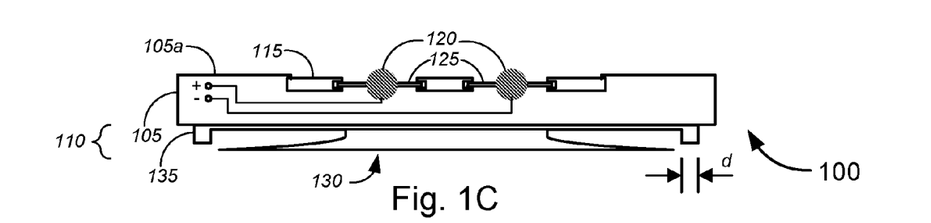
FIG. 1C is a front sectional schematic diagram of a docking station with a passive suction base, in accordance with various embodiments.
Figure 1D:
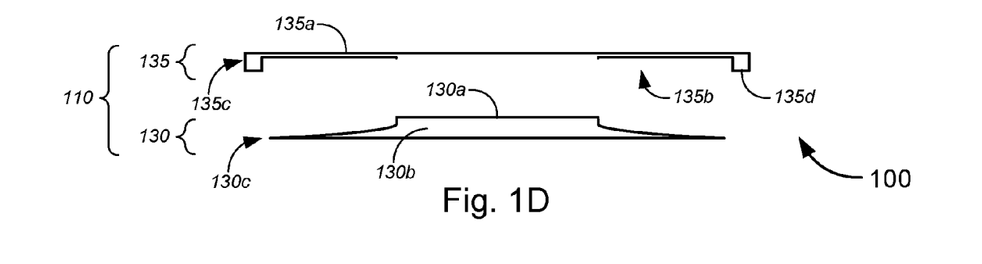
FIG. 1D is an exploded view of a passive suction base, in accordance with various embodiments.

FIG. 1B is a front elevation view of a docking station 105 (e.g., as shown in FIG. 1A) with a passive suction base 110, in accordance with various embodiments. FIG. 1C is a front sectional diagram of a docking station 105 (e.g., as shown along the A-A section line in FIG. 1A) with a passive suction base 110, in accordance with various embodiments. FIG. 1D is an exploded view of a passive suction base 110, e.g., as shown in FIG. 1C, in accordance with various embodiments. While the examples herein describe the user of a passive suction base 110 with a docking station 105, one skilled in the art should appreciate that other embodiments might be used as passive suction bases for any variety of devices or items.

As shown in FIGS. 1B-1D, passive suction base 110 can comprise a rubber or elastomeric flap 130 and a base portion 135. In one aspect, base portion 135 comprises a top portion 135a, a bottom portion 135b, a perimeter portion 135c, and a foot portion 135d. Base portion 135 may, in some embodiments, be a portion that is separate yet affixed via top portion 135a to a bottom surface of the item (e.g., docking station 105). In some aspects, the base portion 135 may be removably affixed to the bottom surface of the item, e.g., via mechanical fasteners, clamps, or brackets, via screws/bolts, or via other non-permanent attachment structures (as understood by those skilled in the art). In other aspects, the base portion 135 may be permanently affixed to the bottom surface of the item, e.g., via adhesives, via molding, via soldering, via welding, or via other permanent attachment methods (as understood by those skilled in the art).

In alternative embodiments, base portion 135 may be integrally formed with the item (e.g., docking station 105); in some examples, integrally forming the base portion 135 with the item includes forming a common interior portion within the item and the base portion 135 (not shown)—i.e., without all (or a portion) of top portion 135a (as shown in FIG. 1D) and without a corresponding bottom portion of the item at least where the base portion 135 joins the item.

Figure 5:
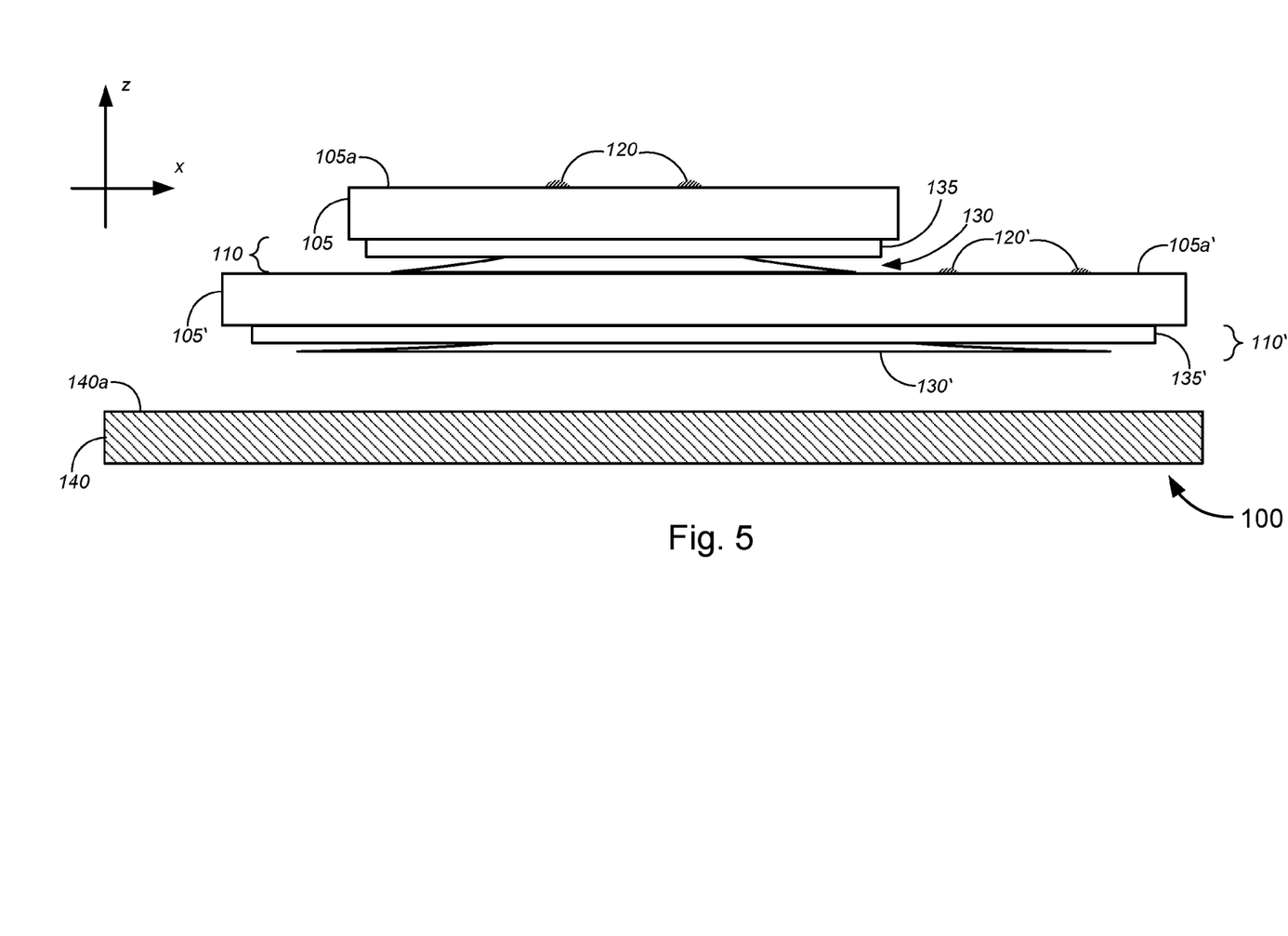
FIG. 5 is a front elevation view of a docking station with a passive suction base as it is lifting via passive suction a larger docking station 105' from a flat surface, in accordance with various embodiments.

Referring to FIG. 1D, perimeter portion 135c may be recessed with respect to a side portion of the item (e.g., docking station 105), as shown in FIGS. 1-7, or may be flush with the side portion of the item. Foot portion 135d, according to some aspects, may extend in a direction opposite to a direction that is normal to (i.e., orthogonal/perpendicular to a plane defined by) surface 105a; that is, foot portion 135d extends in a negative z-axis direction as shown in FIGS. 3-5. Foot portion 135d may, in some embodiments, have a depth d extending inward from perimeter portion 135c. Depth d may be any length (e.g., 1 mm to several centimeters), so long as foot portion 135d is deep enough to support the weight of the item (e.g., docking station 105).

Rubber flap 130, according to some embodiments, comprises a generally flat rubber, silicone, or elastomeric material having a central portion 130a that is affixed to a flat bottom surface 135b of base portion 135 of the item (e.g., docking station 105). In the examples in which the base portion 135 is integrally formed with the item (e.g., the docking station 105), the bottom surface 135b may constitute the bottom surface of the item itself. Rubber flap 130 further comprises interior portion 130b and perimeter portion 130c.

As illustrated in the figures, the perimeter portion 130c of the rubber flap 130 is not affixed to the bottom surface 135b of the base portion 135 (or the bottom portion of the item). The (outer) perimeter portion 130c, in some embodiments, might extend, e.g., approximately 1-2 inches (or ~2.5 to ~5.1 cm) from (outer) perimeter 135c. In other embodiments, perimeter portion 130c might extend, e.g., by approximately a distance of 1.5-5 times the depth d from (outer) perimeter 135c. According to some embodiments, perimeter portion 130c might extend, e.g., approximately 1-5 inches (or ~2.5 to ~12.7 cm) from (an outer perimeter of) central portion 130a, depending on the length and width (or diameter) of rubber flap 130. The perimeter portion 130c, in some embodiments, might extend from the central portion 130a, e.g., by approximately the length/width/diameter of central portion 130a (i.e., extending by a third of the length/width/diameter dimension of rubber flap 130). Other ratios of the extension of the perimeter portion 130c from the central portion 130a with respect to the length/width/diameter of central portion 130a are also possible, so long as the perimeter portion 130c is not substantially attached to the bottom portion 135b. Generally, the greater this ratio, the greater the volume of space created when the item (e.g., docking station 105) is lifted from the flat surface, while the perimeter portion 130c remains in contact with the flat surface. Generally, the greater the volume of space created, the greater the negative relative pressure generated between the passive suction base 110 and the flat surface. Practically, however, this ratio should not be so large that the negative relative pressure generated is so large as to cause central portion 130a to detach (at least in part) from the bottom portion 135b or to cause perimeter portion 130c to detach (at least in part) from the central portion 130a.

Figure 1E:
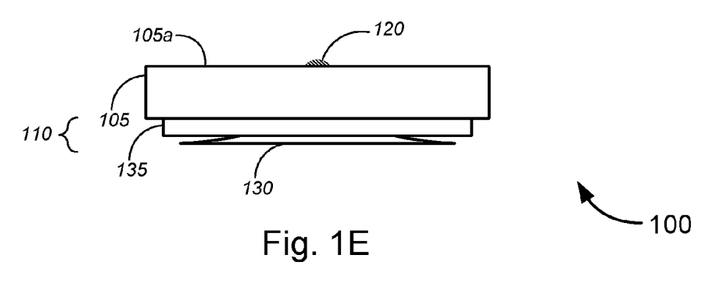
FIG. 1E is a side elevation view of a docking station with a passive suction base, in accordance with various embodiments.
Figure 1F:
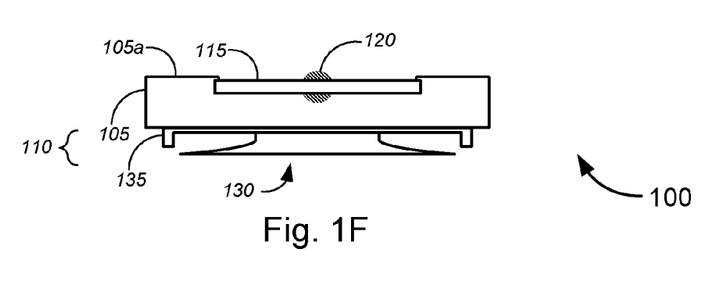
FIG. 1F is a side sectional schematic diagram of a docking station with a passive suction base, in accordance with various embodiments.
Figure 1G:
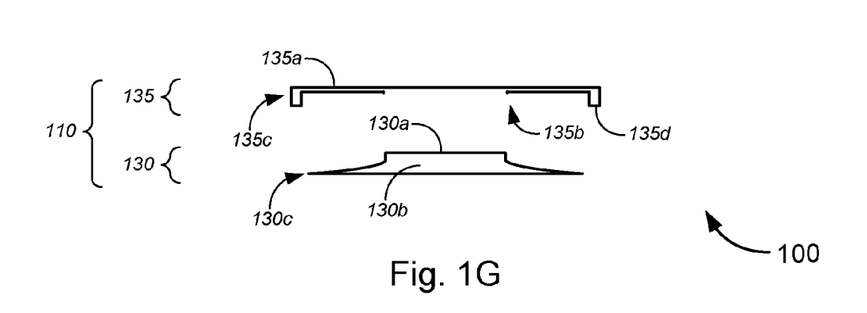
FIG. 1G is an exploded view of a passive suction base portion, in accordance with various embodiments.

FIGS. 1E-1G illustrate the docking station 105 of FIGS. 1A-1D as shown from the side. FIG. 1E is a side elevation view of a docking station 105 (e.g., as shown in FIG. 1A) with a passive suction base 110, in accordance with various embodiments. FIG. 1F is a sectional diagram of a docking station 105 (e.g., as shown along the B-B section line in FIG. 1A) with a passive suction base 110, in accordance with various embodiments. FIG. 1G is an exploded view of a passive suction base portion 110, e.g., as shown in FIG. 1F, in accordance with various embodiments.

FIG. 2 illustrates an embodiment of a docking station 105 resting on a surface 140a of a table or counter 140 or other flat surface. FIG. 2A is a front elevation view of a docking station 105 (such as that shown in FIG. 1A) with passive suction base 110 resting on a flat surface, in accordance with various embodiments. FIG. 2B is a sectional diagram of a docking station 105 (e.g., as shown along the A-A section line in FIG. 1A), with a passive suction base 110 resting on a flat surface, in accordance with various embodiments. FIG. 2C is a side elevation view of docking station 105 (e.g., as shown in FIG. 1A) with passive suction base 110 resting on a flat surface, in accordance with various embodiments. FIG. 2D is a side sectional schematic diagram of docking station 105 (e.g., as shown along the B-B direction in FIG. 1A) with passive suction base 110 resting on a flat surface, in accordance with various embodiments.

As illustrated, when the item (e.g., docking station 105), and thus the passive suction base 110, is placed on a surface 140a of a table or counter 140 (the table or counter 140 having a bottom surface 140b and an edge 140c, as shown in FIG. 4), the rubber flap 130 lies substantially flat against the surface 140a (with the central portion 130a flat or almost flat with respect to the flat surface). In some embodiments, a bit of air space in the interior portion 130b is possible (i.e., with the central portion 130a raised by a gap distance from the flat surface) without detrimentally affecting the functionality of the passive suction base 110. With the passive suction base 110 lying flat against the surface 140a (i.e., with central portion 130a touching or almost touching the flat surface), any negative relative pressure generated between rubber flap 130 and the surface 140a is minimal, and thus, the item (e.g., docking station 105) and the passive suction base 110 can freely move in any direction parallel to a plane defined by the x and y axes (i.e., with foot portion 135d making contact with surface 140a while in motion).

Figure 2A:
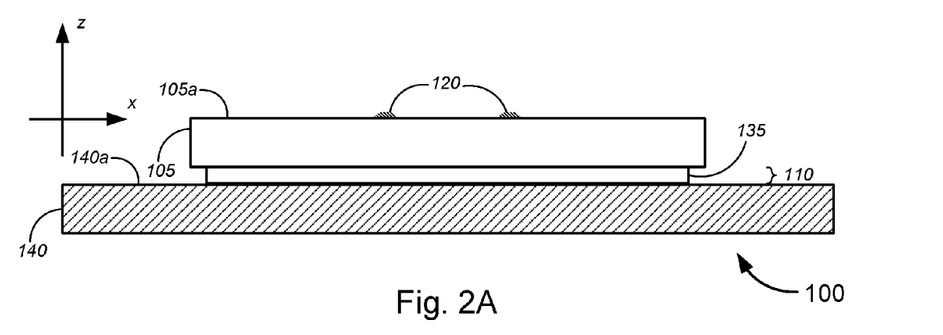
FIG. 2A is a front elevation view of a docking station with a passive suction base resting on a flat surface, in accordance with various embodiments.
Figure 2B:
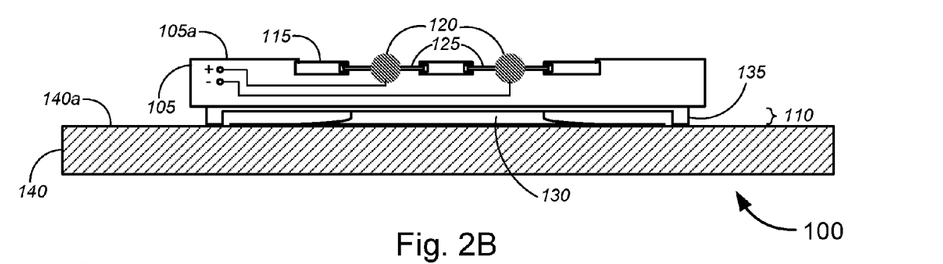
FIG. 2B is a front sectional schematic diagram of a docking station with a passive suction base resting on a flat surface, in accordance with various embodiments.
Figure 2C:
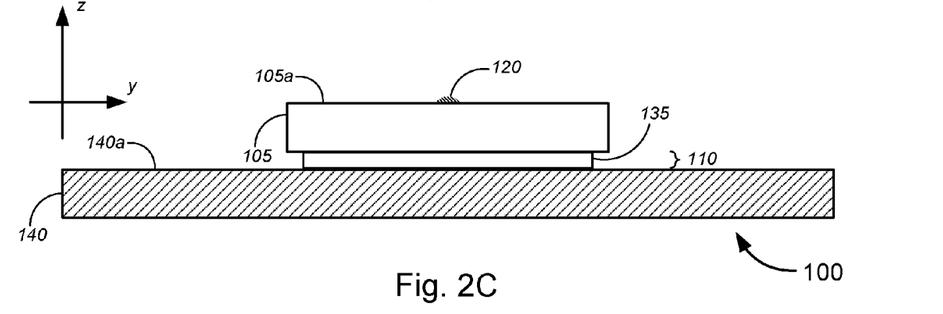
FIG. 2C is a side elevation view of docking station with a passive suction base resting on a flat surface, in accordance with various embodiments.
Figure 2D:
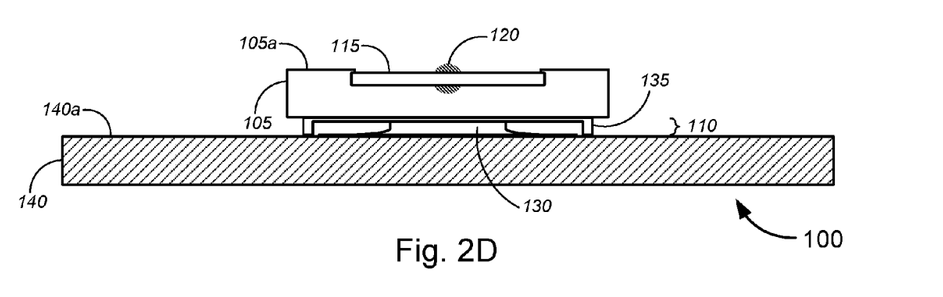
FIG. 2D is a side sectional schematic diagram of docking station with a passive suction base resting on a flat surface, in accordance with various embodiments.
Figure 3A:
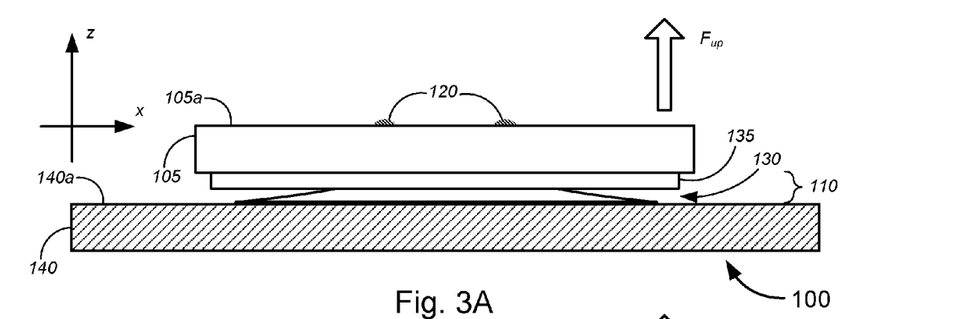
FIGS. 3A-3D are diagrams illustrating a docking station with a passive suction base as it is being lifted from a flat surface, in accordance with various embodiments.
Figure 3B:
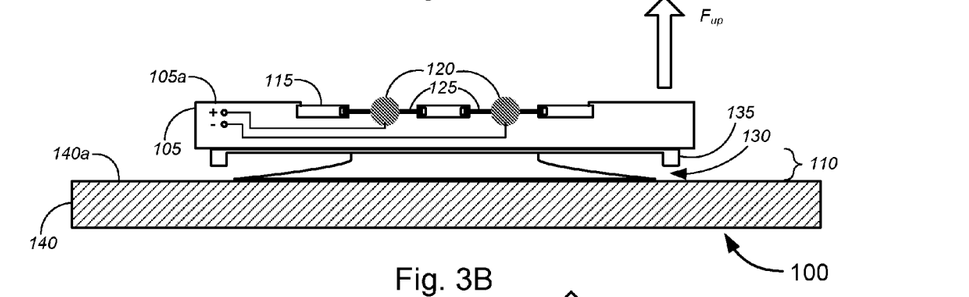
Figure 3C:
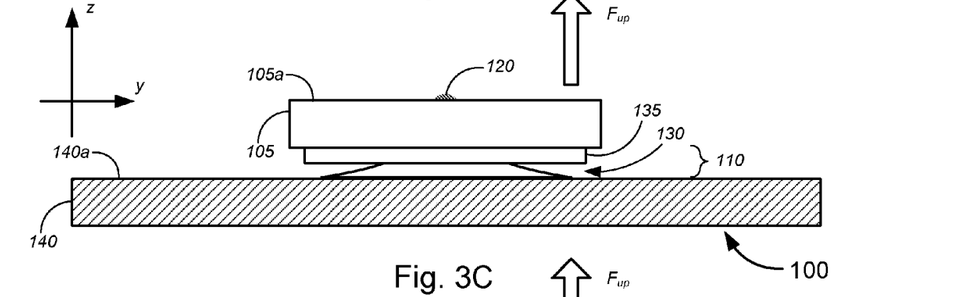
Figure 3D:
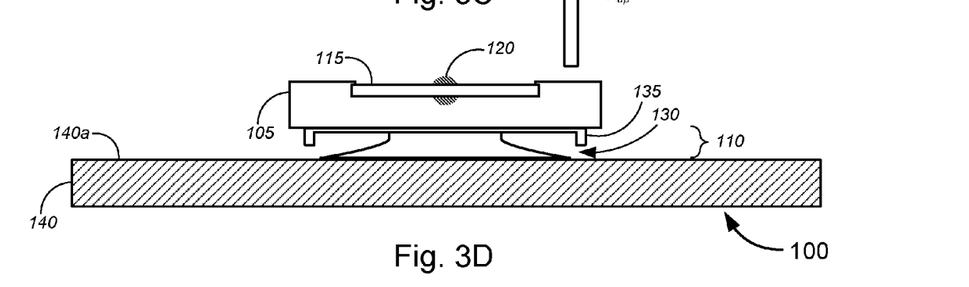

In a particular aspect of some embodiments, the flap 130 might be attached directly to a bottom of the docking station 105 (or other device), without need for a base portion. Optionally, in such embodiments, the bottom of the docking station 105 (or other device) might have an indentation that corresponds to the surface area of the flap 130 and has a depth that is approximately the thickness of the flap 130 (or slightly more or less), such that the docking station 105 or other device conceals the flap 130 when the docking station 105 (or other device) is resting on the surface 140, and the docking station 105 appears to be resting directly on the surface 140. In such embodiments, the flap 130 can still be equally effective to provide the suction features described herein. (In embodiments with a base portion 135, the flap 130 can be mounted in an indentation in the base portion 135, in similar fashion, for example, as shown in FIGS. 2B and 2D.)

FIGS. 3A-3D are diagrams illustrating a docking station 105 with a passive suction base 110 as it is being lifted from the flat surface in the z-axis direction, in accordance with various embodiments. As illustrated, when the item (e.g., docking station 105) is lifted from surface 140a in the z-axis direction (or more precisely, when any upward force $F_{up}$ or any force generally normal to the surface 140a of table/counter 140 in a direction opposite the surface 140a, or in any direction that is at a non-zero angle with respect to the plane defined by the x and y axes), the central portion 130a may move away from the surface 140a, while the perimeter portion 130c remains in contact with surface 140a, effectively increasing the volume between the rubber flap 130 of the passive suction base 110 and the surface 140a (thereby increasing the volume within interior portion 130b). This increase in volume results in a negative relative pressure between the rubber flap 130 and the surface 140a (i.e., generating a vacuum therebetween), which results in adhesion between the passive suction base 110 and the surface 140a. Such adhesion prevents the item (e.g., the docking station 105) from being lifted off the surface 140a.

We now turn to FIG. 4, which is a front elevation view of a docking station 105 (such as that shown in FIG. 1A) with passive suction base 110 as it is being disengaged from the flat surface, in accordance with various embodiments. As illustrated, when it is desired for the item (e.g., docking station 105) with the passive suction base 110 to be lifted (i.e., disengaged) from surface 140a, a user may slide the passive suction base 110 (and the item) across the surface 140a (i.e., in any direction parallel with the x-y plane) until perimeter portion 130c extends over an edge 140c of the table or counter 140, such that the vacuum (or space) in interior portion 130b is breached. Thereafter, the adhesion force (i.e., negative relative pressure) is released, thus allowing the item (e.g., docking station 105) with the passive suction base 110 to be lifted or disengaged from surface 140a.

In the embodiments described thus far, the passive suction base 110 has been depicted as adhering to a table-top or counter-top surface 140a, but the various embodiments are not so limited. Passive suction base 110 may, in some embodiments, be adhered to any flat surface. For example, FIG. 5 shows a front elevation view of docking station 105 (as shown in FIG. 1A) with passive suction base 110 as it is lifting via passive suction a larger docking station 105' from the flat surface, in accordance with various embodiments. As illustrated in FIG. 5, larger docking station 105' comprises a flat surface 105a', charging contacts 120', and passive suction base 110' (which comprises rubber flap 130' and base portion 135'). The item (e.g., docking station 105) with passive suction base 110 may adhere to surface 105a' in a manner similar to that as described above with respect to FIGS. 2 and 3. As shown in FIG. 5, the passive suction base 110 may create an adhesion force with respect to surface 105a' that is sufficiently strong to lift larger docking station 105' (from the surface 140a, i.e., in a similar manner as described with respect to FIG. 4), despite the greater weight of the larger docking station. In some embodiments, the passive suction base can provide sufficient adherent force to lift a 3-4 lb. item, which provides sufficient anchoring capability to ensure that a docking station 105 will not be (inadvertently) dislodged when the docked item (e.g., a handset 150 as shown in FIG. 7) is removed from the docking station 105.

Figure 6A:
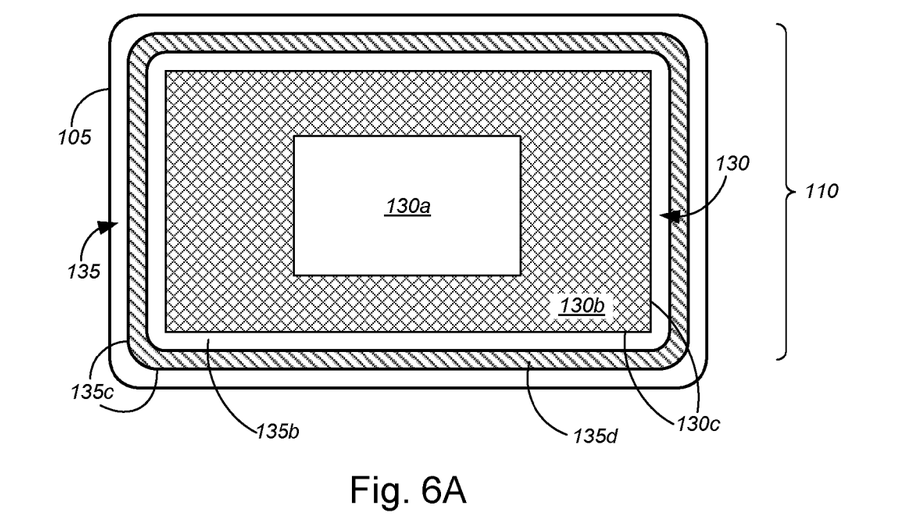
FIGS. 6A-6F are bottom plan views of variously shaped docking stations with various examples of passive suction bases, in accordance with various embodiments.

FIGS. 6A-6F are bottom plan views of variously shaped docking stations 105 with various examples of passive suction bases 110, to illustrate features provided by various embodiments. In FIG. 6A, a generally rectangular flap 130, which is attached to bottom portion 135b of base portion 135 of passive suction base 110, is shown positioned within the boundary created by foot portion 135d, with a gap between perimeter portion 135c and an inner wall of foot portion 135d. When the passive suction base 110 is placed on a flat surface (e.g., surface 140a, as shown in FIGS. 2-5), foot portion 135d may rest on the flat surface, while flap 130 may lay generally flat against the flat surface. In such a generally flat configuration, central portion 130a may be relatively close to the flat surface, such that the interior portion 130b has a small volume (or space). When the item 105 with passive suction base 110 is being lifted from a flat surface, central portion 130a, which is shown in FIG. 6A as being rectangular in shape, moves away from the flat surface, while perimeter portion 130c remains in contact with the flat surface, resulting in an increase in volume (or space) in interior portion 130b, thus generating a vacuum or negative relative pressure that prevents the item 105 with the passive suction base 110 from being lifted from the flat surface.

Figure 6B:
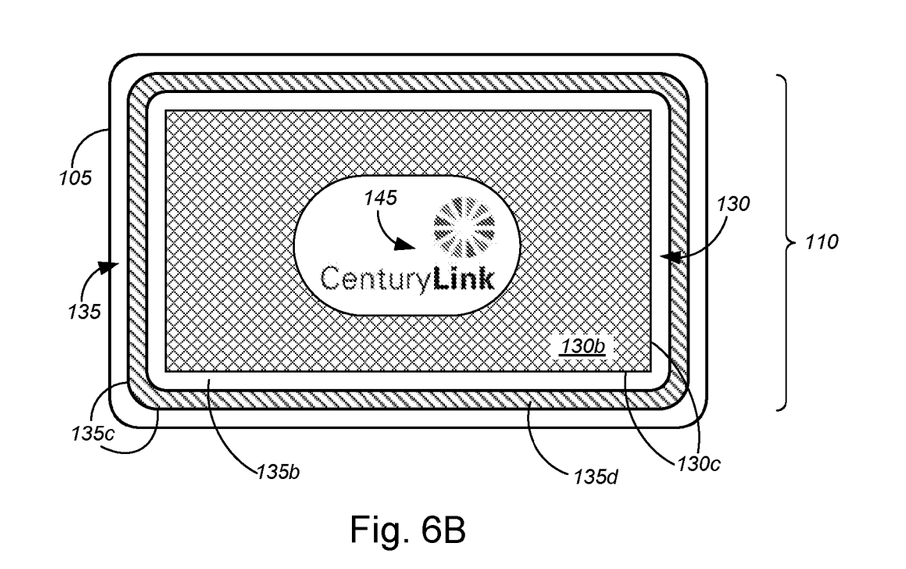
Figure 6C:
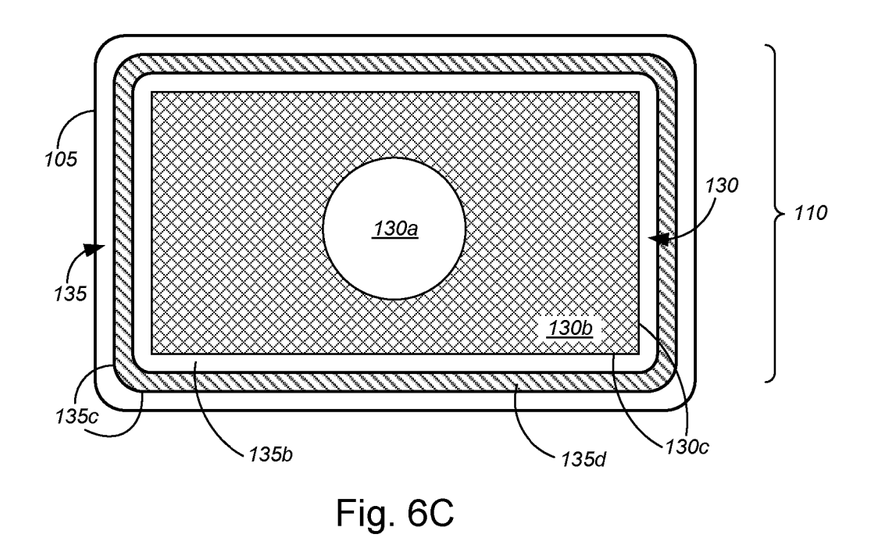

As shown in FIG. 6A-6C, central portion 130a may be any shape, including, but not limited to, a rectangle, an oval, and a circle. In fact, central portion 130a may be any curved shape or polygonal shape. In addition, as shown in FIGS. 6A-6D, the item 105 (and thus the passive suction base 110) may be any shape, including, but not limited to, a rectangle, an oval, and/or a combination thereof. In fact, the item 105 (and thus the passive suction base 110) may be any curved shape, polygonal shape, or a combination of curved and polygonal shapes. Although it may be advantageous for the shape of the base 110 to be concentric with the shape of the item 105 (e.g., to maximize the area of the base 110 without exceeding the contour of the item 105), this is not required.

Figure 6D:
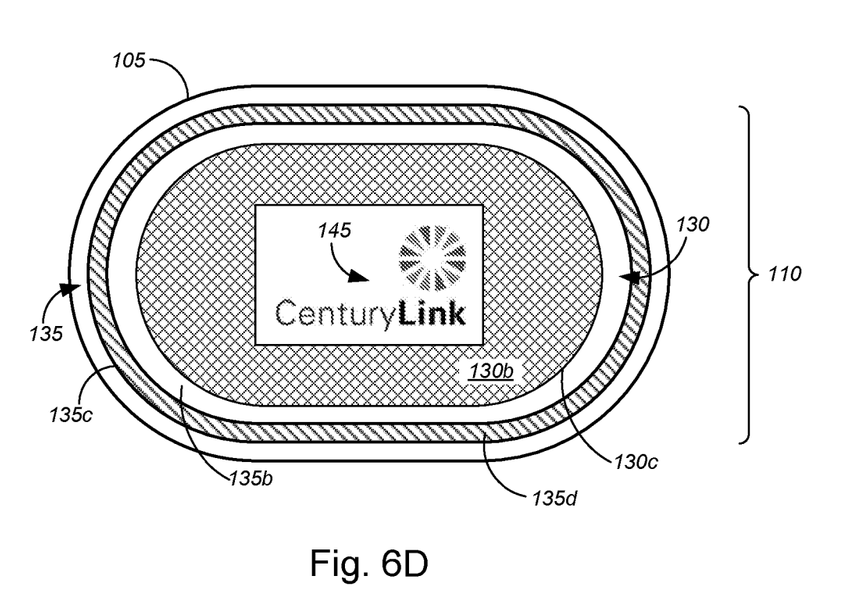
Figure 6E:
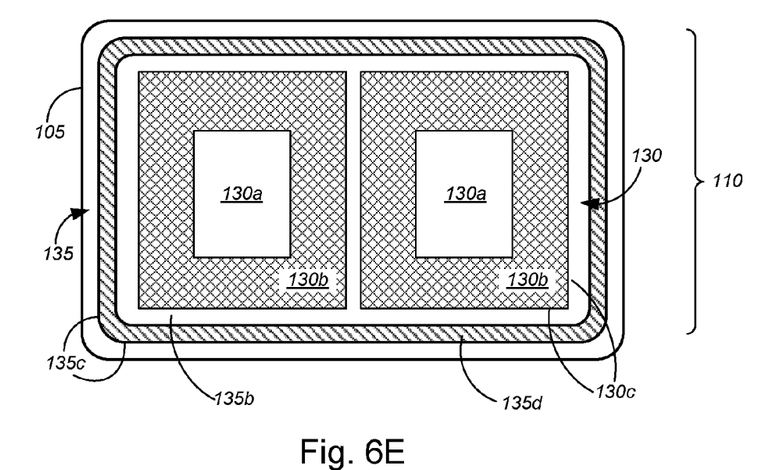
Figure 6F:
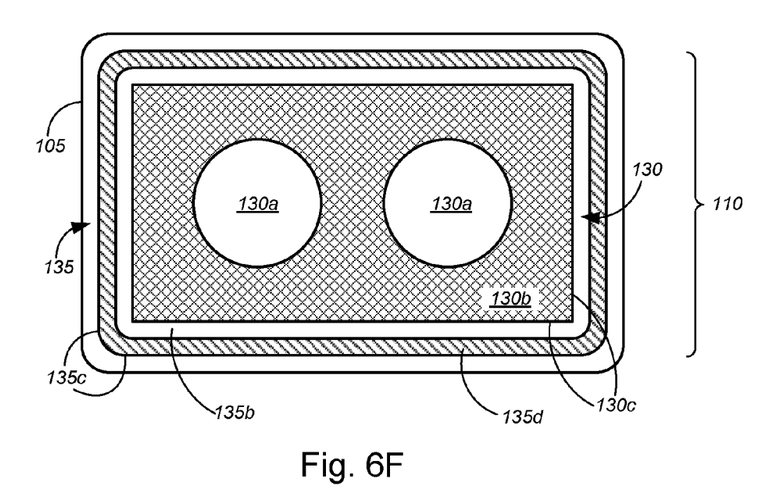

Also, as illustrated in FIGS. 6B and 6D, a design (e.g., a logo (such as a company/organization logo or group logo, etc.), artwork, icons, brand information, regulatory information such as FCC information, patent pending notices or patent numbers, etc.) may, according to some embodiments, be etched (via, e.g., laser etching, mechanical etching, acid etching, etc.) or otherwise marked by any known methods onto a part of central portion 130a that faces interior space 130b or onto any bottom surface of flap 130 (except the outer edge(s) of perimeter portion 130c). Such etched designs do not significantly or negatively affect the adherent properties of passive suction base 110 (i.e., the adhesion force that may be generated by flap 130 when passive suction base 110 is being lifted from a flat surface (as discussed above)).

Passive suction base 110, according to some embodiments, may comprise a single flap 130 with a single central portion 130a (as shown, e.g., in FIGS. 6A-6D). Alternatively, passive suction base 110, in some embodiments, may comprise two or more flaps 130 each having a central portion 130a (as shown, e.g., in FIG. 6E) or may comprise a single flap 130 having multiple central portions 130a (as shown, e.g., in FIG. 6F). According to some embodiments, any combination of single or multiple flaps 130 with single or multiple central portions 130a may be implemented, where item 105 and flap(s) 130 may be of any combination of shapes (e.g., as discussed above with respect to FIGS. 6A-6D).

FIG. 7A is a generalized diagram illustrating a top perspective view of docking station 105 together with a bottom perspective view of a wireless handset 150, in accordance with various embodiments. FIG. 7B is a front elevation view of the wireless handset 150, e.g., as shown in FIG. 7A, in accordance with various embodiments. FIG. 7C is a sectional view of a docking station 105, e.g., as shown along the A-A section line in FIG. 1A and a sectional view of a wireless handset 150, e.g., as shown along the C-C section line in FIG. 7A, in accordance with various embodiments. As illustrated, handset 150 may be docked with docking station 105, such that charging contacts 120 mate with (i.e., touch) charging contacts 155, in order to supply electrical power from docking station 105 (which may be coupled to a power source, such as a 120V or 220V outlet) to power handset 150 or to charge batteries located in handset 150. Detailed description of the docking station 105 and handset 150, as well as their functionalities may be found, e.g., in U.S. patent application Ser. No. 13/722,902 by Riering-Czekalla et al. and titled "Magnetic Docking Base for Handset", as mentioned above, except that docking station 105 has passive suction base 110 (which comprises flap 130 and base portion 135) as discussed in detail above with respect to FIGS. 1-6.

An additional benefit provided by the various embodiments, as shown in FIGS. 1-7, is that the flap 130 of passive suction base 110 is not visible in normal operation when the item (e.g., docking station 105) is resting on a flat surface, so that the functionality of the passive suction base 110 can be employed without affecting the aesthetics of the docking station 105 (or other item) that the passive suction base 110 anchors to a flat surface.

While certain features and aspects have been described with respect to exemplary embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture but instead can be implemented on any suitable hardware, firmware and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. An item comprising a passive suction base, the passive suction base of the item comprising:
   a base portion affixed to a bottom of the item, the base portion comprising a foot portion and a bottom portion; and
   a flap portion, the flap portion comprising a central portion and a perimeter portion, wherein the central portion is affixed to the item by being affixed to the bottom portion of the base portion, wherein the central portion, at a point where the central portion is affixed to the bottom portion of the base portion, defines a first shape, wherein the foot portion substantially surrounds the perimeter portion, wherein when the flap portion is placed in contact with a flat surface, only a force opposing the flat surface, in a direction away from the flat surface, being applied to the item causes the central portion to move away from the flat surface with the perimeter portion remaining in contact with the flat surface, thereby causing the passive suction base to adhere to the flat surface, the perimeter portion of the flap portion having a second shape that is different from the first shape of the central portion of the flap portion;
   wherein when the base portion is resting on the flat surface, no external force perpendicular to the flat surface is applied to the flap portion, and the flap portion is substantially flat and parallel with respect to the flat surface in a manner in which the air between the flap portion and the flat surface is minimal, thereby having a minimal negative relative pressure generated between the flap portion and the surface, so as to decrease an adherent force between the passive suction base and the flat surface, to allow the passive suction base to be moved parallel to and along the flat surface while supported by the foot portion, which is in contact with the flat surface.

2. The item of claim 1, wherein the flap portion comprises a material selected from a group consisting of rubber, silicone, and other elastomeric material.

3. The item of claim 1, wherein the foot portion comprises a bottom contact portion and an inner wall portion, and wherein when the base portion is resting on the flat surface, the bottom contact portion of the foot portion rests on the flat surface, such that the inner wall portion, the bottom portion of the base portion, and the flat surface define an interior space.

4. The item of claim 3, wherein when the passive suction base is resting on the flat surface, the flap portion is hidden from external view within the interior space.

5. The item of claim 3, wherein the item comprises an outer wall surrounding a perimeter of the item, wherein the foot portion further comprises an outer wall portion, and wherein at least a portion of the outer wall portion is at least one of recessed with respect to at least a portion of the outer wall of the item or flush with respect to at least a portion of the outer wall of the item.

6. The item of claim 1, wherein the flap portion comprises one of a single flap or a plurality of flaps.

7. The item of claim 1, wherein the central portion comprises one of a single central portion or a plurality of central portions.

8. The item of claim 1, wherein a shape of the perimeter portion is selected from a group consisting of circle, oval, polygon, and a combination thereof.

9. The item of claim 1, wherein at least a portion of the central portion comprises a region configured to be marked with a design including at least one of a logo, artwork, icons, brand information, regulatory information, or patent protection status information.

10. The item of claim 9, wherein the region is configured to be marked by an etching process, said etching process being selected from a group consisting of laser etching, mechanical etching, and acid etching.

11. A docking station for an electronic device, the docking station comprising:
a passive suction base comprising:
  a base portion affixed to a bottom of the docking station, the base portion comprising a foot portion and a bottom portion; and
  a flap portion, the flap portion comprising a central portion and a perimeter portion, wherein the central portion is affixed to the docking station by being affixed to the bottom portion of the base portion, wherein the central portion, at a point where the central portion is affixed to the bottom portion of the base portion, defines a first shape, wherein the foot portion substantially surrounds the perimeter portion, wherein when the flap portion is placed in contact with a flat surface, only a force opposing the flat surface, in a direction away from the flat surface, being applied to the item causes the central portion to move away from the flat surface with the perimeter portion remaining in contact with the flat surface, thereby causing the passive suction base to adhere to the flat surface, the perimeter portion of the flap portion having a second shape that is different from the first shape of the central portion of the flap portion;
  wherein when the base portion is resting on the flat surface, no external force perpendicular to the flat surface is applied to the flap portion, and the flap portion is substantially flat and parallel with respect to the flat surface in a manner in which the air between the flap portion and the flat surface is minimal, thereby having a minimal negative relative pressure generated between the flap portion and the surface, so as to decrease an adherent force between the passive suction base and the flat surface, to allow the passive suction base to be moved parallel to and along the flat surface while supported by the foot portion, which is in contact with the flat surface.

12. The docking station of claim 11, further comprising:
first charging contacts configured to mate with corresponding second charging contacts on an electronic device that is configured to dock with the docking station, wherein the first charging contacts are configured to supply electrical power to the second charging contacts.

13. A method, comprising:
placing a docking station on a flat surface, the docking station comprising a passive suction base, the passive suction base comprising:
  a base portion affixed to a bottom of the docking station, the base portion comprising a foot portion and a bottom portion; and
  a flap portion, the flap portion comprising a central portion and a perimeter portion, wherein the central portion is affixed to the docking station by being affixed to the bottom portion of the base portion, wherein the central portion, at a point where the central portion is affixed to the bottom portion of the base portion, defines a first shape, wherein the foot portion substantially surrounds the perimeter portion, wherein when the flap portion is placed in contact with a flat surface, only a force opposing the flat surface, in a direction away from the flat surface, being applied to the item causes the central portion to move away from the flat surface with the perimeter portion remaining in contact with the flat surface, thereby causing the passive suction base to adhere to the flat surface, the perimeter portion of the flap portion having a second shape that is different from the first shape of the central portion of the flap portion;
  wherein when the base portion is resting on the flat surface, no external force perpendicular to the flat surface is applied to the flap portion, and the flap portion is substantially flat and parallel with respect to the flat surface in a manner in which the air between the flap portion and the flat surface is minimal, thereby having a minimal negative relative pressure generated between the flap portion and the surface, so as to decrease an adherent force between the passive suction base and the flat surface, to allow the passive suction base to be moved parallel to and along the flat surface while supported by the foot portion, which is in contact with the flat surface.

14. The method of claim 13, further comprising:
sliding the docking station to an edge of the flat surface, so that at least a portion of the perimeter portion is no longer in contact with the flat surface; and
removing the docking station from the flat surface.

* * * * *